US011254560B2

(12) United States Patent
Tingleff et al.

(10) Patent No.: US 11,254,560 B2
(45) Date of Patent: Feb. 22, 2022

(54) TRANSCONDUCTANCE AMPLIFIER (71) Applicant: Knowles Electronics, LLC, Itasca, IL (US)

(72) Inventors: Jens Tingleff, Copenhagen (DK); Claus Erdmann Fürst, Roskilde (DK)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 240 days.

(21) Appl. No.: 16/445,080

(22) Filed: Jun. 18, 2019

(65) Prior Publication Data
US 2020/0010315 A1 Jan. 9, 2020

Related U.S. Application Data

(60) Provisional application No. 62/690,863, filed on Jun. 27, 2018, provisional application No. 62/687,198, filed on Jun. 19, 2018.

(51) Int. Cl.
*B81B 3/00* (2006.01)
*H04R 19/04* (2006.01)

(52) U.S. Cl.
CPC .......... *B81B 3/0021* (2013.01); *H04R 19/04* (2013.01); *B81B 2201/0257* (2013.01); *B81B 2203/0127* (2013.01)

(58) Field of Classification Search
CPC .......... B81B 3/0021; B81B 2201/0257; B81B 2203/0127; H04R 19/04
USPC ........................................................ 381/174
See application file for complete search history.

(56) References Cited

U.S. PATENT DOCUMENTS

| | | |
|---|---|---|
| 5,596,289 A | 1/1997 | Liu |
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |

(Continued)

FOREIGN PATENT DOCUMENTS

| | | |
|---|---|---|
| GB | 2 525 674 A | 11/2015 |
| WO | WO-02/03747 A2 | 1/2002 |

(Continued)

OTHER PUBLICATIONS

U.S. Appl. No. 62/135,804, filed Mar. 20, 2015, Knowles Electronics LLC.

(Continued)

*Primary Examiner* — Sean H Nguyen
(74) *Attorney, Agent, or Firm* — Foley & Lardner LLP (57) ABSTRACT

The present disclosure relates to an integrated circuit comprising a transconductance amplifier which is connectable to a microelectromechanical systems (MEMS) transducer. The transconductance amplifier comprises a first input coupled to a first current conveyor and a second input coupled to a second current conveyor for converting a single-ended or differential transducer signal voltage into an intermediate signal current representative of the transducer signal voltage through a shared reference resistor. The transconductance amplifier further comprises first and second output circuits coupled to the shared reference resistor and being configured to convert the intermediate current signal into a corresponding differential output current signal through first and second output terminals for driving a load.

20 Claims, 5 Drawing Sheets

(56) References Cited

U.S. PATENT DOCUMENTS

| | | |
|---|---|---|
| 7,829,961 B2 | 11/2010 | Hsiao |
| 7,856,804 B2 | 12/2010 | Laming et al. |
| 7,903,831 B2 | 3/2011 | Song |
| 9,831,844 B2 | 11/2017 | Yurrtas et al. |
| 10,298,245 B1 | 5/2019 | De Berti et al. |
| 2005/0207605 A1 | 9/2005 | Dehe et al. |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0176882 A1 | 7/2010 | Wei |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0051954 A1 | 3/2011 | Thomsen et al. |
| 2011/0075875 A1 | 3/2011 | Wu et al. |
| 2011/0142261 A1 | 6/2011 | Josefsson |
| 2012/0250925 A1 | 10/2012 | Lillelund |
| 2013/0271307 A1 | 10/2013 | Kropfitsch et al. |
| 2015/0097711 A1 | 4/2015 | Schuurmans |
| 2016/0133271 A1 | 5/2016 | Kuntzman |
| 2016/0134975 A1 | 5/2016 | Kuntzman et al. |
| 2016/0149542 A1 | 5/2016 | Mucha et al. |
| 2016/0150325 A1 | 5/2016 | Oliaei |
| 2016/0352294 A1 | 12/2016 | Nicollini et al. |
| 2017/0077911 A1 | 3/2017 | Badillo et al. |
| 2018/0004317 A1 | 1/2018 | Bohannon et al. |
| 2018/0014123 A1 | 1/2018 | Shajaan et al. |
| 2018/0027338 A1 | 1/2018 | Shajaan et al. |

FOREIGN PATENT DOCUMENTS

| | | |
|---|---|---|
| WO | WO-2016/153851 A1 | 9/2016 |
| WO | WO-2018/106514 A1 | 6/2018 |

OTHER PUBLICATIONS

U.S. Appl. No. 62/237,165, filed Oct. 5, 2015, Knowles Electronics LLC.

U.S. Appl. No. 62/245,028, filed Oct. 22, 2015, Knowles Electronics LLC.

U.S. Appl. No. 62/261,496, filed Dec. 1, 2015, Knowles Electronics LLC.

International Search Report and Written Opinion for International Application No. PCT/US2019/037805 dated Sep. 19, 2019, 16 pages.

International Search Report and Written Opinion for International Application No. PCT/US2019/037803 dated Sep. 19, 2019, 18 pages.

TRANSCONDUCTANCE AMPLIFIER

CROSS-REFERENCE TO RELATED PATENT APPLICATIONS

This application claims the benefit of and priority to U.S. Provisional Patent Application No. 62/687,198 filed Jun. 19, 2018, and to U.S. Provisional Patent Application No. 62/690,863 filed Jun. 27, 2018, the entire disclosures each of which are incorporated by reference herein.

BACKGROUND

Certain, typically portable, communication and computing devices such as smartphones, smart speakers, IoT (Internet of Things) devices, mobile phones, tablets, etc. are compact devices which usually are powered from rechargeable battery sources. The compact dimensions and battery source put severe constraints on the maximum acceptable dimensions and/or power consumption of transducer and sensor amplification circuitry such as microphone amplification circuits, accelerometer amplifiers, gyroscopic amplifiers, pressure sensors amplification circuits etc. utilized in such portable communication devices or other types of portable or stationary electronics equipment.

Additionally, such compact devices utilizing microphones and microphone amplification circuits have a relatively limited overload margin, which may lead to distorted or 'clipped' amplified microphone signals; in particular for such devices utilizing a voltage-based amplifier or the like. There exists a continued need to increase the margin before signal overload or other types of distortion of the amplified transducer signal takes place. The overload and distortion problems are often caused by saturation of active amplification circuitry and elements such as traditional preamplifiers of the signal processing circuits.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

In the following a detailed description of various embodiments of the transconductance amplifier are described with reference to the appended drawings. The skilled person will understand that the accompanying drawings are schematic and simplified for clarity and therefore merely show details which are essential to the understanding of the present disclosure, while other details have been left out. Like reference numerals refer to like elements or components throughout. Like elements or components will therefore not necessarily be described in detail with respect to each figure. It will further be appreciated that certain actions and/or steps may be described or depicted in a particular order of occurrence while those skilled in the art will understand that such specificity with respect to sequence is not actually required.

DETAILED DESCRIPTION

Figure 1:
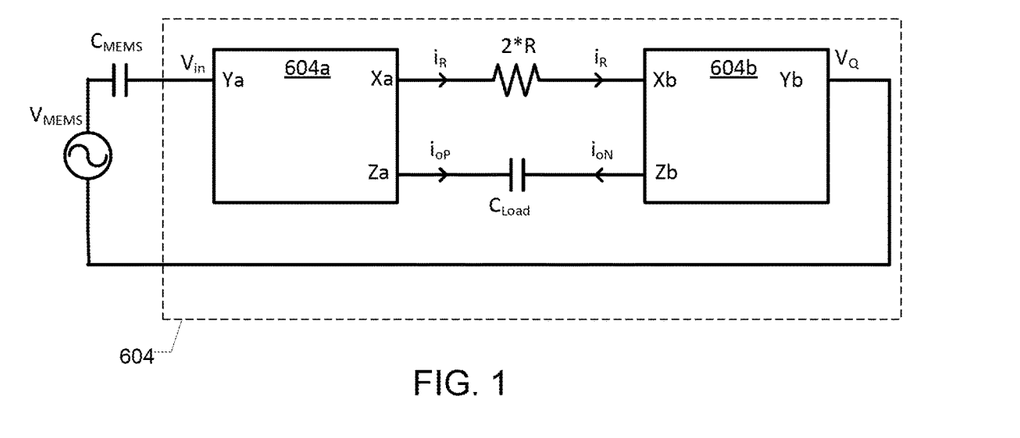
FIG. 1 shows a top-level block diagram of an exemplary transconductance amplifier according to various embodiments.

FIG. 1 shows a top-level block diagram of an exemplary transconductance amplifier 604 suitable for integration or incorporation in various types of processing circuits for amplifying or buffering signals from various types of sensors and transducers, in particular capacitive sensors such as capacitive microphone transducers, piezo-electrical transducers etc. The transconductance amplifier 604 may be fabricated on an integrated circuit for example using CMOS semiconductor fabrication processes. The skilled person will understand that the transconductance amplifier 604 in the alternative may be used as sensor amplifier for various types of sensors like ultrasound sensors, optical or piezo-ceramic accelerometers, strain-gauge devices etc. These and other suitable sensors and transducers may be fabricated using microelectromechanical systems (MEMS) or other known or future technology.

The transconductance amplifier 604 comprises a first current conveyor 604a and a second current conveyor 604b electrically connected to a common or shared reference resistor or resistance 2*R. An input Ya of the first current conveyor 604a and an input of Yb of the second current conveyor 604b forms a differential input of the transconductance amplifier 604. The inputs Ya, Yb are electrically connected to a transducer element, represented by a signal source $V_{MEMS}$ and an equivalent generator capacitance $C_{MEMS}$. The transducer element may comprise a MEMS transducer element. One of the inputs Ya, Yb may additionally be connected to a DC bias voltage source (not shown) to set appropriate DC bias voltages at the first and second inputs Ya, Yb of the transconductance amplifier 604. The transducer element generates a differential transducer signal voltage signal $V_{in}$ in response to impinging sound and this differential transducer signal voltage signal is applied to the differential input of the of the transconductance amplifier 604 formed by the inputs Ya, Yb.

The skilled person will understand that other embodiments may utilize a single-ended transducer signal voltage such that the transducer output is coupled to one of the inputs Ya, Yb while the other transducer output is connected to either ground or a fixed DC reference voltage.

The first current conveyor 604a and second current conveyor 604b are configured to in conjunction convert the single-ended or differential transducer signal voltage into an intermediate signal current $I_R$ representative of the transducer signal voltage $V_{in}$ using the shared reference resistor 2*R as discussed in additional detail below with reference to the circuit diagram of FIG. 2. The intermediate signal current $I_R$ flows through first and second internal nodes Xa and Xb of first and current conveyors 604a, 604b, respectively. The transconductance amplifier 604 additionally comprises first and second output circuits (not shown) that are coupled to the shared reference resistor 2*R and configured to convert the intermediate current signal $I_R$ into a corresponding differential output current signal $I_{oP}$, $I_{oN}$ flowing through a pair of output terminals Za and Zb of the transconductance amplifier 604. The conversion of the intermediate current signal $I_R$ into the differential output current signal $I_{oP}$, $I_{oN}$ may be carried out by first and second current mirror-arrangements (not shown) as discussed in additional detail elsewhere in the specification. A load $C_{Load}$ of the transconductance amplifier 604 is electrically connected to the output terminals Za and Zb such that the transconductance amplifier 604 supplies drive current and voltage to the load. The skilled person will understand that various types of resistive, inductive or capacitive loads may be coupled to the output terminals Za and Zb depending on a particular application and in all cases driven by the differential output current signal $I_{oP}$, $I_{oN}$.

Figure 2:
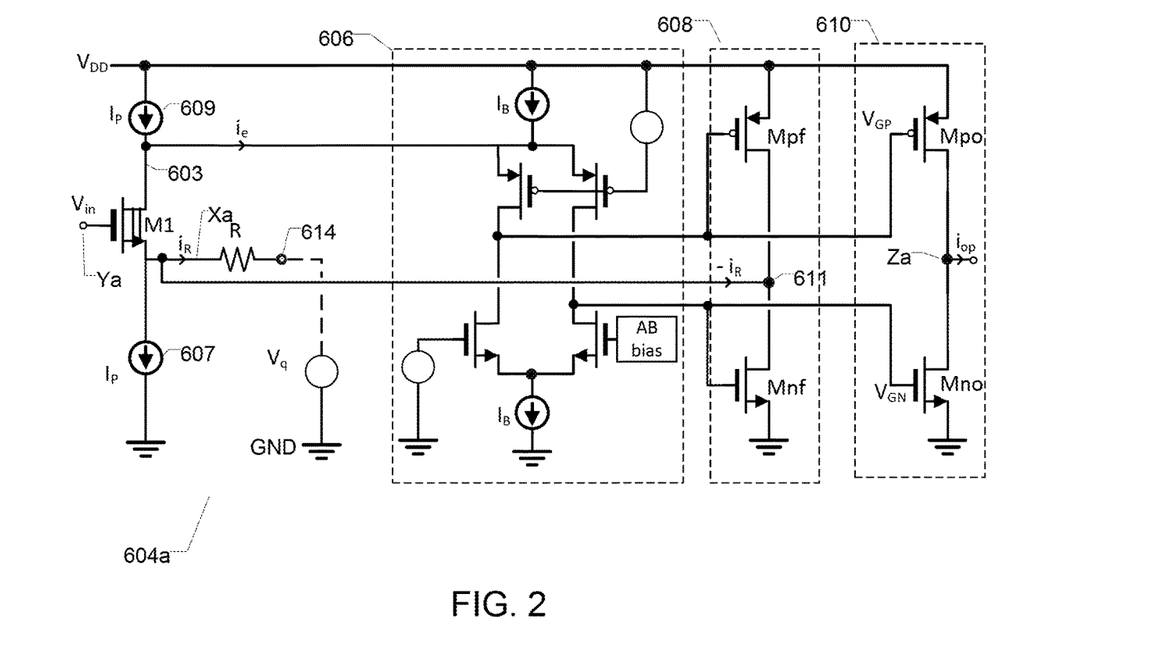
FIG. 2 shows a schematic circuit diagram of one-half of an exemplary transconductance amplifier according to a preferred embodiment.

FIG. 2 shows a schematic circuit diagram of the first current conveyor 604a which may largely correspond to one-half of the previously discussed transconductance amplifier 604. The transconductance amplifier 604 is preferably suitable for integration or incorporation in an integrated processing circuit 122 of a MEMS microphone assembly 100 as discussed below in additional below. The schematic circuit diagram depicts essentially one-half of the complete transconductance amplifier 604 discussed above. The first current conveyor 604a receives and converts one input polarity of the transducer signal voltage from the MEMS transducer element while a corresponding second half (not shown) of the transconductance amplifier 604 handles the opposite polarity of the microphone signal voltage. Hence, a differential output current signal, or amplified current signal, representative of the transducer signal voltage, is generated or provided between the illustrated output node Za and its complementary output node (Zb of FIG. 1) of the transconductance amplifier 104. The complete circuit of the transconductance amplifier 604, i.e. both half-circuits, is preferably fully symmetric such that the common node 614 at the midpoint of the shared reference resistance or resistor 2*R is constant, i.e. without signal voltage swing, for a balanced or differential input signal such as the previously discussed differential microphone signal voltage. The voltage source Vq is merely a symbolic illustration of the return path, of the intermediate signal current $I_R$ within the second-half circuit of the transconductance amplifier 604) allowing the flow of current.

The resistor R represent one-half of the shared reference resistor 2*R. The resistance of the shared reference resistor 2*R sets an intermediate transconductance of the input stage of the transconductance amplifier 604. The resistance of the shared reference resistor 2*R may lie between 1 kΩ and 5 kΩ leading to an intermediate transconductance between 0.2 mS and 1 mS.

An input stage of the first current conveyor 604a is configured to apply the first polarity of the transducer signal voltage to the resistor R, which represents one-half of the shared reference resistor 2*R as mentioned above. The skilled person will appreciate that the topology and components of the second current conveyor 604b are nominally identical to those of the first current conveyor 604a. Hence, a second, input stage (not shown) is configured to apply the second polarity of the transducer signal voltage to the shared reference resistor such that the shared reference resistor determines the intermediate transconductance of the first and second input stages 604a, 604b.

The input stage of the first current conveyor 604a comprises an input transistor M1 which may comprise a MOSFET or JFET, since each of these devices exhibits very large input impedance. The input transistor M1 may for example be a native NMOS transistor. The positive polarity or phase of the transducer signal voltage is applied to a control, i.e. gate, terminal of the input transistor M1 which gate terminal may be directly connected to one of a backplate and diaphragm of a MEMS transducer element. The connection to the input transistor M1 may not represent a significant electrical loading of the MEMS transducer element due to the large input impedance at the gate terminal of M1. A DC bias current through the input transistor M1 is fixed by a pair of input bias current sources $I_P$ 609, 607. The first or high-side input bias current source 609 is connected in series with a drain terminal of M1 and the second, or low-side, input bias current source 607 is connected in series with a source terminal of M1. The DC bias currents of the input bias current sources $I_P$ 609, 607 are essentially equal such that the DC bias current through M1 is held substantially constant despite variations of the transducer signal voltage. This mechanism or property holds the gate-source voltage of M1 essentially constant and therefore leads to a copying or transfer of the first polarity transducer signal voltage to the reference resistor R. The DC input bias current may for example be set to a value between 10 μA and 100 μA where a higher bias current generally lowers the input referred noise voltage albeit at the expense of an increasing power consumption.

The transconductance amplifier 604 additionally comprises an output circuit which comprises a first class AB output stage 610 and a first output bias circuit 606 which is configured to set a predetermined quiescent current, or DC bias current, through the first class AB output stage 610. The first class AB output stage 610 comprises complementary PMOS/NMOS output transistors Mpo and Mno that driven by respective gate drive voltage VGP and VGN. The PMOS/NMOS output transistors Mpo and Mno are connected in series between a first, e.g. positive DC supply voltage $V_{DD}$ and a negative DC supply voltage or ground GND. The output node Za of the first current conveyor 604a, and therefore the first output node or terminal of the transconductance amplifier 604, is a mid-point connection between the output transistors Mpo and Mno. The skilled person will understand that alternative embodiments of the transconductance amplifier 604 may comprise a first cascode transistor connected in series with the first output transistor Mpo and a second cascode transistor connected in series with the second output transistor Mno—for example to improve linearity or power supply rejection of the first class AB output stage 610. The positive DC supply voltage $V_{DD}$ may be between 1.2 V and 3.3 V, such as around 1.4 V, depending on application specific requirements and characteristics of the particular semiconductor process used for integration of the transconductance amplifier 604. The quiescent current consumption of the complete transconductance amplifier 604 may be set to a value between 75 μA and 250 μA for typical microphone applications.

The first output bias circuit 606 sets appropriate DC bias currents, or quiescent currents, through the complementary PMOS/NMOS output transistors Mpo and Mno by controlling the respective DC gate voltages $V_{GP}$ and $V_{GN}$. The first output bias circuit 606 additionally functions as a part of a also forms part of current feedback loop by passing an error current as discussed below. The first output bias circuit 606 may at least in some embodiments sense the gate voltages $V_{GP}$ and $V_{GN}$ of the PMOS/NMOS output transistors by a feedback mechanism through the feedback column or circuit 608. By this feedback mechanism the AB bias circuit 606 may set the quiescent operating conditions of the PMOS/NMOS output transistors. Hence, the first output bias circuit sets or controls the DC bias current flowing through the output transistors Mpo and Mno under quiescent conditions, i.e. at zero transducer signal voltage. The AB bias circuit 606 is configured such that the quiescent current in the class AB output stage 610 is significantly smaller than a maximum output current of the class AB output stage. The quiescent current in the class AB output stage 610 may in some exemplary embodiments of the transconductance amplifier 604 lie between 1 μA and 10 μA while the maximum output signal current may be lie between 100 μA and 1000 μA such as about 200 μA.

The first output bias circuit 606 further comprises a current feedback loop, coupled from the drain terminal 603 of the first input transistor M1 through a pair of PMOS source follower loads of the first output bias circuit 606. The pair of PMOS source followers functions a current buffer circuit buffering an error current $I_e$ flowing out of the drain terminal 603 of M1 and through the drain terminals of the pair of PMOS source follower loads. The buffered error current ($I_e$) is configured to adjust the respective gate voltages $V_{GP}$ and $V_{GN}$ of the first and second output transistors Mpo and Mno of the class AB output stage, and also current in the feedback transistors Mpf and Mnf of the feedback column 608, such that the respective signal currents through first and second output transistors Mpo and Mno are set to achieve current balance around the first input transistor M1. The respective signal currents through first and second output transistors are adjusted because of the change of the respective gate drive voltages $V_{GP}$ and $V_{GN}$. The current feedback loop forces the intermediate current signal $-I_R$ flowing out of the feedback column 608 and the IR flowing into, or entering, the reference resistor R, at node Xa, to be substantially identical. Therefore, the current feedback loop is adjusting the error current $I_e$ to substantially zero when the current feedback loop is operating in a settled state or condition.

The first output circuit comprises a first push-pull current mirror arrangement configured to copy the intermediate current signal IR to the first class AB output stage to generate the first polarity or phase $I_{oP}$ of the differential output current signal. The first push-pull current mirror arrangement comprises the feedback column or circuit 608 which comprises an output node 611, at a midpoint connection between the respective drain terminals of MOSFETs Mpf and Mnf, connected to a first end of the reference resistor R for sinking and sourcing the first polarity of the intermediate signal current IR to the reference resistor R. The first end of the reference resistor R is also connected to the internal node Xa. A gate terminal of the PMOS transistor Mpf of the feedback column or circuit 608 is connected to the gate terminal of the first, or high-side, PMOS output transistor Mpo of the class AB output stage 610 such that the intermediate signal current flowing out of, or into, the drain of the PMOS transistor Mpf of the output circuit is copied to, or mirrored to, the drain terminal of the high-side PMOS output transistor Mpo of the class AB output stage 610 for a positive polarity, i.e. sourcing, of the output current signal $I_{oP}$. In the corresponding manner, a gate terminal of the NMOS transistor Mnf of the feedback circuit 608 is connected to the gate terminal of the second, or low-side, NMOS output transistor Mno of the class AB output stage 610 such that the intermediate signal current flowing out of, or into, the drain of Mnf is copied to, or mirrored to, the drain terminal of Mno for a negative polarity, sinking, of the output current signal Ia. In effect the mirroring or coping of the intermediate signal current IR to the high-side and low-side output transistor Mpo, Mno controls the amplitude or level of the output current signal. The skilled person will appreciate the current mirror connection between Mpf and Mpo and the current mirror connection between Mnf and Mno may be configured to provide current amplification, current attenuation, or 1:1 current copying by selecting appropriate relative dimensions of the MOS transistors Mpf and Mpo and appropriate relative dimensions between the Mnf and Mno. In some embodiments, the first push-pull current mirror arrangement is configured to provide an amplification of the intermediate signal current $I_R$ on 2-20 such as an amplification between 8 and 12.

The skilled person will understand that the first output circuit may comprise one or more push-pull current mirror arrangements configured to copy the intermediate current signal IR to one or more additional class AB output stages. Hence, multiple and possibly differently scaled copies of the differential output signal current can readily be provided.

The skilled person will understand that the transconductance (gm) of the transconductance amplifier 604 is determined by previously discussed intermediate transconductance, controlled by the resistance of the shared reference resistor 2*R, and the current amplification of the first and second push-pull current mirror arrangements. In case the amplification of each of the first and second push-pull current mirror arrangements is one, i.e. current copying, then the transconductance (gm) of the transconductance amplifier 604 may be controlled exclusively by the resistance of the shared reference resistor as discussed above.

The class AB output stage 610 typically operates without voltage signal feedback from the output nodes Za and Zb of the first and second current conveyors back to the input nodes Ya, Yb of the transconductance amplifier 604. The lack of voltage signal feedback around the class AB output stage 610 ensures that the transconductance amplifier 604 exhibits high output impedance at the output node 612 which is beneficial for the reasons discussed in additional detail elsewhere in the specification. The transconductance amplifier 604 may be designed or configured to exhibit an output impedance, measured at 1 kHz, is larger than 1 MΩ, or preferably larger than 10 MΩ such as larger than 50 MΩ.

The skilled person will understand that the relatively high noise current flowing through output transistors $M_{PO}$ and $M_{no}$ would lead to unacceptable noise performance of the transconductance amplifier 604 when the class AB output stage 610 lacks output signal feedback. This problem has been addressed and solved by the above-mentioned small level of quiescent current running in the class AB output stage 610, e.g. about 3 μA. The small quiescent current of the class AB output stage leads to a low noise current at small or zero microphone signal voltages at the inputs. On the other hand, the much larger maximum output current capability of the class AB output stage, as discussed above, leads to an increased noise level in class AB output stage 610 at increasing level of the differential output signal current such that the noise level of the class AB output stage 610 is dependent on the level or magnitude of the microphone signal voltage. However, this is fully acceptable for numerous applications, in particular audio applications, because the higher noise level of the class AB output stage 610 at large output current signals is perceptually masked by the high level of the audio signal.

Consequently, the transconductance amplifier 604 exhibits a large dynamic range, satisfactory noise performance, large output impedance and low quiescent current/power consumption.

Figure 3:
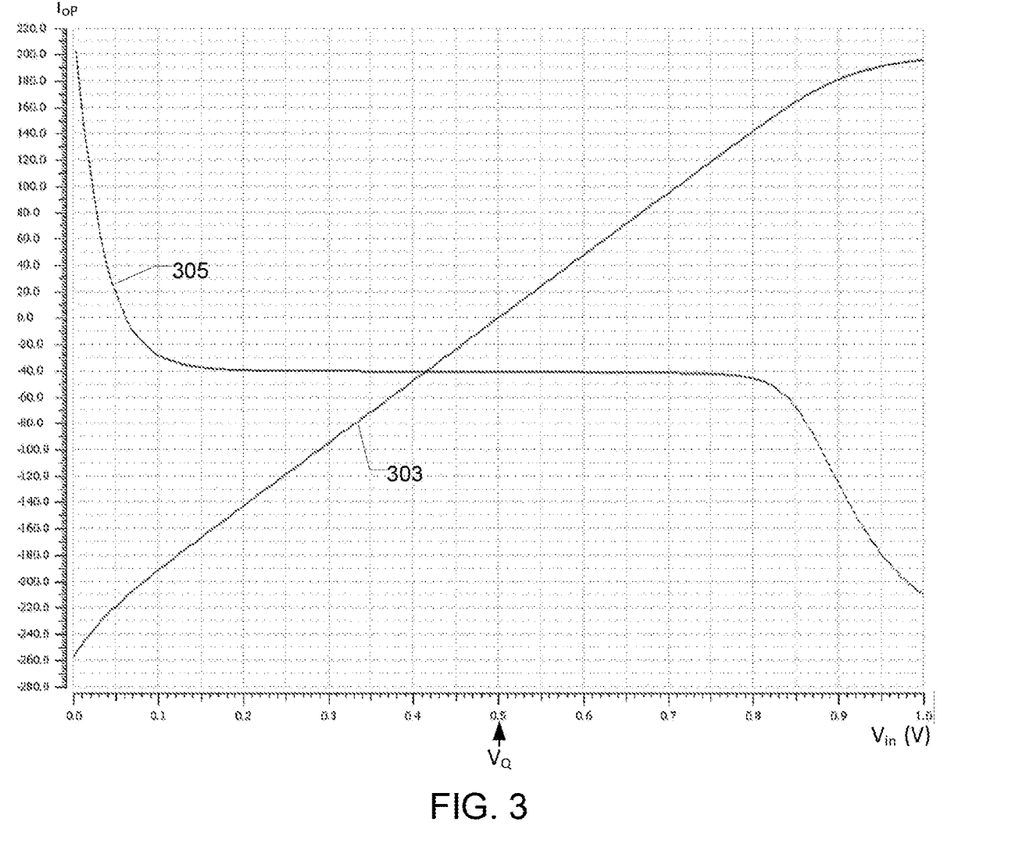
FIG. 3 shows a plot of a differential output current of a class AB output stage of the transconductance amplifier as function of the differential input signal voltage signal $V_{in}$ at first and second inputs of the transconductance amplifier and a plot of the corresponding transconductance (gm) of the amplifier.

FIG. 3 shows a first plot 303 of the differential output current $i_o=(i_{oP}-i_{oN})$ of the class AB output stage as function of the differential input signal voltage signal $V_{in}$ applied at the first and second inputs Ya, Yb of the previously disclosed transconductance amplifier and a second plot 305 of the corresponding (computed) transconductance (gm) of the amplifier. The plots show simulated results on a transistor level model of the transconductance amplifier. Hence, the first plot 303 is a DC sweep from 0.0 V to 1.0 V illustrating the large-signal behavior of the exemplary transconductance amplifier. The units of the x-axis is Volt while the unit on the y-axis, showing the differential output current as function of the DC input voltage, is μA. The DC bias voltage setting at the first and second inputs of the exemplary transconductance amplifier is indicated by the arrow marked $V_Q$ and is about 0.50 V. The skilled person will notice that the differential output current exhibits good linearity across a large range of the differential input signal voltage signal $V_{in}$—at least from about 0.1 Volt to 0.85 Volt. The good linearity is also reflected by the near-constant transconductance (gm) of the transconductance amplifier within this DC input voltage range. The transconductance (gm) within the linear range is about 0.48 mS corresponding to about $$\frac{1}{2.048\ \text{kohm}}.$$

Figure 4:
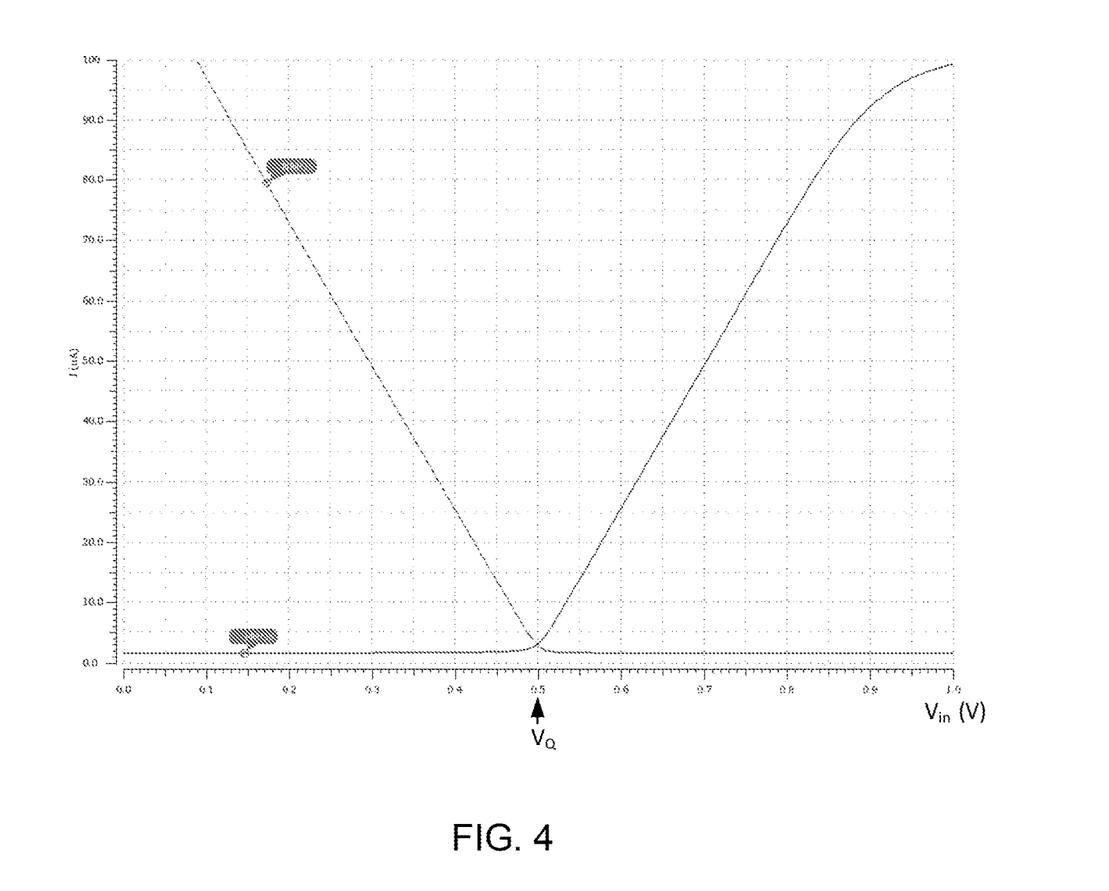
FIG. 4 shows a plot of the respective currents through the high-side and low-side output transistors of the class AB output stage of the transconductance amplifier as function of the differential input signal voltage signal.

FIG. 4 shows plots of the respective currents through the high-side and low-side PMOS/NMOS output transistors Mpo, Mno of the class AB output stage 610 of the transconductance amplifier as function of the differential input signal voltage signal $V_{in}$ applied at the first and second inputs Ya, Yb of the previously disclosed transconductance amplifier. The plots show simulated results on a transistor level model of the transconductance amplifier. The dotted line plot marked as "NMOS" is the current through the NMOS output transistor Mno and the full line plot marked as "PMOS" is the current through the PMOS output transistor Mpo. The unit of the x-axis is Volt while the unit on the y-axis, showing the transistor current is μA. The DC bias voltage setting at the first and second inputs of the exemplary transconductance amplifier is indicated by the arrow marked $V_Q$ and is about 0.50 V. Hence, the NMOS plot and PMOS plot show the large-signal behavior of the individual PMOS and NMOS output transistors of class AB output stage 610 of the transconductance amplifier. The skilled person will notice that the quiescent current through the first class AB output stage, corresponding to a DC input voltage $V_Q$ of about 0.5 V, is about 2-3 μA while the current through the NMOS output transistor Mno reaches a maximum value of about 100 μA for small DC input voltages around 0.1 V and falls down to the quiescent current level of about 2-3 μA for differential input voltage exceeding $V_Q$. The current through the PMOS output transistor Mpo has a maximum value of about 100 μA for DC input voltages approaching 1.0 V and rapidly drops down to the quiescent current level of about 2-3 μA for differential input voltage below $V_Q$. These results confirm the class AB behavior of the class AB output stage 610 with a pronounced difference between the output transistor currents under quiescent conditions and large-signal conditions.

Figure 5:
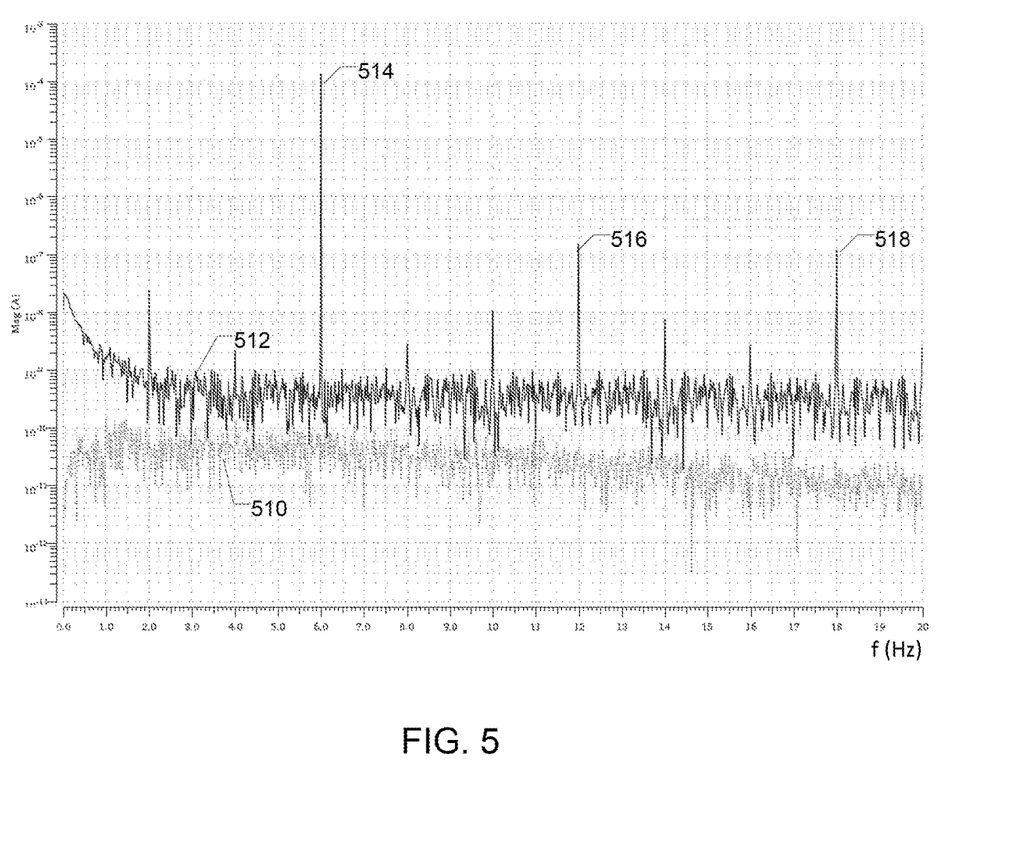
FIG. 5 shows A-weighted frequency spectra of the differential output current of transconductance amplifier for full-scale or maximum level of the differential input signal voltage and for zero level of the differential input signal voltage.

FIG. 5 shows A-weighted frequency spectra of the differential output current of the transconductance amplifier for full-scale level and zero level of the differential input signal voltage. The first frequency spectrum 510 corresponds to zero level of the differential input signal voltage $V_{in}$, i.e. corresponding to the quiescent condition, and show the noise floor varying slightly over frequency on the depicted linear frequency scale from 0 Hz to 20 kHz. The second frequency spectrum 512 corresponds to full-scale level of the differential input signal voltage $V_{in}$ for a 6 kHz test or stimulus tone, i.e. a signal level close to an overload limit of the transconductance amplifier. The test tone component 514 is of course clearly visible in the second frequency spectrum 512 and second and third harmonic components 516, 518 of the test tone also clearly protrude above the noise floor and thus demonstrating the operation close to the overload limit.

Finally, the previously-discussed signal-level dependent modulation of the noise floor of the output signal current is evident by comparison of the first and second frequency spectra 510, 512. This noise modulation reflects the varying signal-level dependent variation of current through the output transistors of the class AB output stage in combination with the lack of output signal feedback to the input of the transconductance amplifier.

Figure 6:
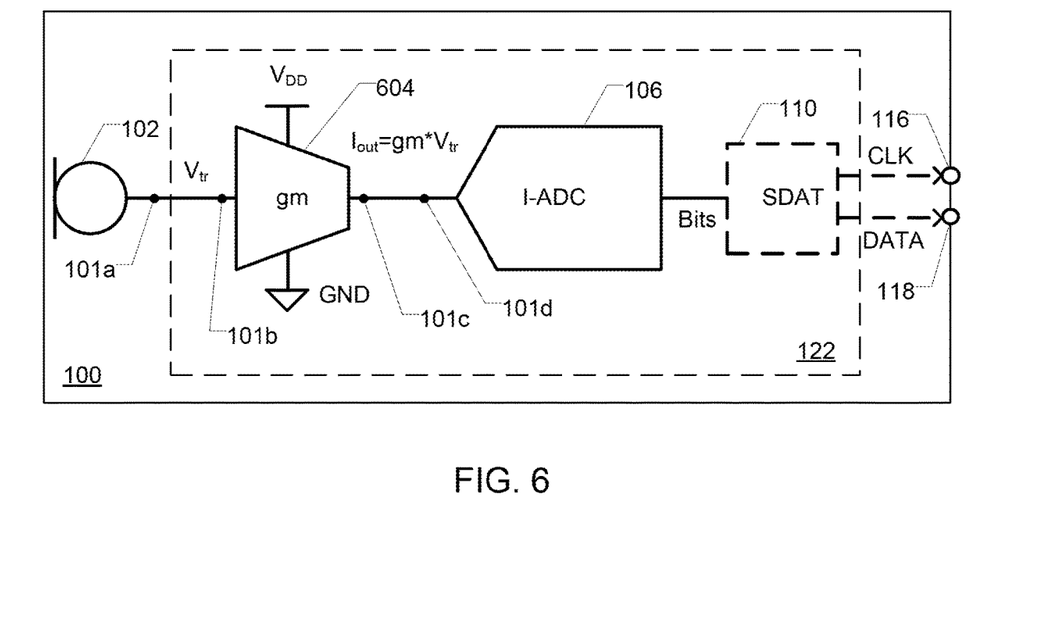
FIG. 6 shows an electrical block diagram of an exemplary miniature microphone assembly comprising a MEMS transducer element coupled to the exemplary transconductance amplifier.

FIG. 6 shows a schematic block diagram of an exemplary miniature transducer assembly 100 comprising a MEMS transducer element 102 coupled to the previously discussed transconductance amplifier 604. The MEMS transducer element 102 may be disposed in a housing (illustrated on FIG. 7). The MEMS transducer element 102 is configured to convert a first physical variable, such as sound pressure, into a transducer signal voltage at a transducer output 101a. The transducer signal voltage may be applied as a single-ended signal or a differential signal to one of both of the input(s) Ya, Yb of the transconductance amplifier 604 via node(s) 101b. The transconductance amplifier 604 is a part of a processing circuit or amplification path 122 of the miniature transducer assembly 100. The processing circuit 122 may be formed as a separate integrated circuit using sub-micron CMOS technology or any other suitable semiconductor manufacturing technology. The transconductance amplifier receives the transducer signal voltage produced by the transducer element 102. As output, the transconductance amplifier 604 generates the differential output current signal representative of the transducer signal voltage in accordance with the predetermined transconductance (gm) of the transconductance amplifier 604. The differential output current signal, e.g. an amplified current signal, of the transconductance amplifier 604 is supplied to an input of a current-input analog-to-digital converter (I-ADC) 106, via interconnected input and output terminals or nodes 101c, 101d. The current-input analog-to-digital converter (I-ADC) 106 accordingly forms the load of the transconductance amplifier 604 according to the present embodiment.

The I-ADC 106 may be configured for sampling and quantizing the amplified current signal to generate a corresponding digital microphone signal. The current input analog-to-digital converter (I-ADC) 106 may comprise at least a first integrator stage (e.g. a current sensitive first integrator stage) for receipt of the amplified current signal. The current-input analog-to-digital converter I-ADC 106 may be adapted to produce a multibit or single-bit digital microphone signal representative of the transducer signal voltage depending on the particular converter type. A beneficial characteristic of a transconductance amplifier in the present context is that the input impedance of it is relatively large, e.g. even in the GΩ range. In some embodiments, the input impedance of the transconductance amplifier 604 is larger than 100 MΩ, such as larger than 1 GΩ.

As mentioned, the transconductance amplifier 604 converts and/or amplifies the received transducer signal voltage, denoted '$V_{tr}$' on FIG. 6, according to the transconductance, denoted 'gm' in FIG. 3, of the transconductance amplifier 604 and produces an amplified or buffered current transducer, denoted '$I_{out}$' in FIG. 6, according to $I_{out}=gm*V_{tr}$. For a transconductance amplifier 604, the dimensionless amplification factor is given by $gm*R_P$, where $R_P$ is an open-loop load resistance of the transconductance amplifier 604 (or an equivalent impedance). $R_P$ is high impedance (see below).

Additionally, providing a large amplification factor '$gm*R_P$' also reduces or minimizes noise of the miniature transducer assembly 100 and thereby maximizes the signal-to-noise ratio (SNR) as disclosed in the following. As mentioned previously, the output of the transconductance amplifier 604 exhibits a high impedance and in some embodiments the load resistance $R_P$ or the equivalent impedance formed of the output impedances of elements connected to node 101c, at 1 kHz, of the transconductance amplifier is larger than 1 MΩ, preferably larger than 10 MΩ such as larger than 50 MΩ. In some embodiments, the predetermined transconductance gm is larger than 1/(200 kΩ) and preferably larger than 1/(2 kΩ). The current-input analog-to-digital converter (I-ADC) 106 enables use of the high impedance output characteristics of the transconductance amplifier 604 as disclosed herein and enables significant reduction of noise.

Therefore to reduce the total noise voltage, the product of gm and $R_P$ should be large, for example at least larger than 5, as discussed below and herein. The total noise voltage may for example be reduced by increasing the respective value of gm and/or of $R_P$ to the largest practically possible value for a given use or application. A large value of $R_P$ reduces its associated noise $I_{noise,RP}$, which is easily implemented in integrated circuit semiconductor technology. Furthermore $gm*R_P$ should be at or above a predetermined value, e.g. at about 5, preferably larger than 10, more preferably larger than 20 or larger than 50, more preferably larger than 200, or larger than 1000. These ranges reduce the noise contribution from the first integrator stage 402 significantly. In some embodiments, the load resistance (or its equivalent impedance) $R_P$, at 1 kHz, of the transconductance amplifier is larger than 1 MΩ, preferably larger than 10 MΩ such as larger than 50 MΩ, when the predetermined transconductance gm is larger than 1/(200 kΩ) and preferably larger than 1/(2 kΩ). In some embodiments, the load resistance (or its equivalent impedance) RP, at 1 kHz, of the transconductance amplifier is about 5 MΩ and the predetermined transconductance gm is about 1/(5 kΩ). In some other embodiments, the load resistance (or its equivalent impedance) RP, at 1 kHz, of the transconductance amplifier is about 10 MΩ and the predetermined transconductance gm is about 1/(2.5 kΩ).

A digitally encoded transducer signal supplied at the output of the current-input analog-to-digital converter I-ADC 106 is provided to an optional input of a digital command and control interface 110, denoted SDAT in FIG. 3. The digital command and control interface 110 may be configured to receive various types of data commands from a host processor (now shown) of a portable communication device (e.g. a smartphone). The command/control interface 110 may include a separate clock line 116 (CLK) that clocks data on a data line 118 (DATA) of the interface 110. The command and control interface 110 may include a standardized data communication interface according to various serial data communication protocols, e.g., I²C, USB, UART, SoundWire or SPI. The command and control interface 110 is in some embodiments configured to structure and encode the digital transducer signal in accordance with the relevant protocol of the interface 110 and transmits the digitally encoded transducer signal to the host processor. Additional aspects and synergistic benefits associated with the interconnection and cooperation between of the present transconductance amplifier 604 and the current-input analog-to-digital converter (I-ADC) 106 are discussed in detail in the applicant's U.S. application No. 62/687,19 the contents of which is hereby enclosed by reference in its entirety.

Figure 7:
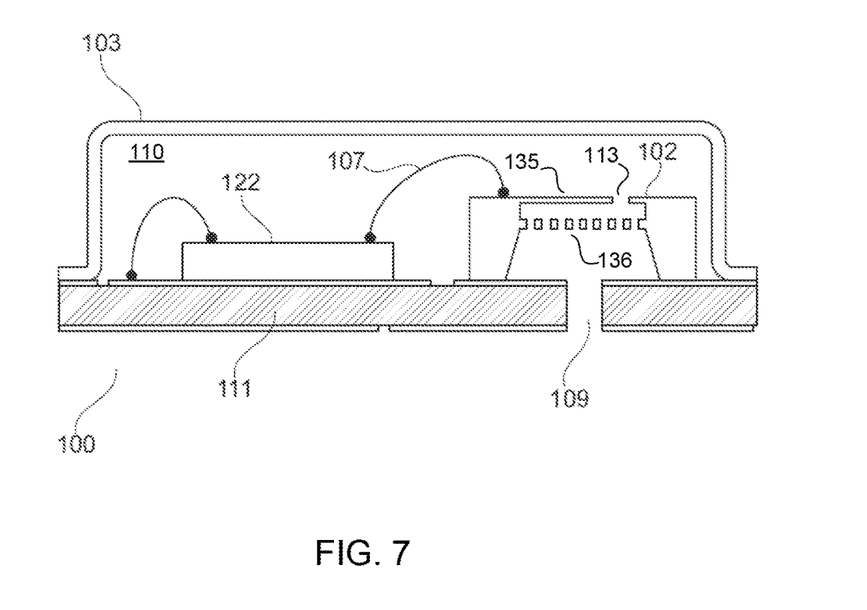
FIG. 7 shows a lateral cross-sectional view of an exemplary miniature microphone assembly.

FIG. 7 is a lateral cross-sectional view through the housing of a specific embodiment of the above-discussed transducer assembly. In the present embodiment, the MEMS transducer element 102 comprises a capacitive sound transducer for capture and conversion of sound signals in the audible range, i.e. a MEMS microphone element, to provide a miniature microphone assembly 100. The capacitive transducer element 102 is configured to convert incoming sound within at least a part of the audible range between 20 Hz and 20 kHz into a corresponding digitally encoded microphone signal. The capacitive transducer element 102 may, for example, exhibit a transducer capacitance between 0.5 pF and 10 pF. The capacitive transducer element may include first and second mutually charged transducer plates, e.g. a diaphragm 135 and back plate 136, respectively, supplying the microphone signal. The charge may be injected onto one of the diaphragm 135 and back plate 136 by an appropriate high-impedance DC bias voltage supply (not shown). The microphone assembly 100 additionally includes the previously discussed processing circuit 122, which may include a semiconductor die, for example a mixed-signal CMOS semiconductor device integrating the various analog and digital circuits disclosed herein. The processing circuit 122 is e.g. shaped and sized for mounting on a substrate or carrier element 111 of the assembly 100, where the carrier element likewise supports the capacitive transducer element 102. The microphone assembly 100 includes a housing lid 103 mounted onto a peripheral edge of the substrate or carrier element 111 such that the housing lid 103 and carrier element 111 jointly form a microphone housing enclosing and protecting the transducer element 102 and the processing circuit 122 of the assembly 100. The microphone housing may include a sound inlet or sound port 109 projecting through the carrier element 111, or through the housing lid 103 in other embodiments, for conveying sound waves to the transducer element 102.

The transducer element 102 generates a microphone signal at a transducer output (see e.g. item 101a of FIG. 3) in response to impinging sound. The transducer output may for example include a pad or terminal of the element 102 that is electrically coupled to the processing circuit 122 via one or more bonding wires 107 electrically interconnecting respective signal pads or terminals of the transducer element 102 and processing circuit 122.

Some aspects of the present disclosure relate to an integrated circuit comprising a transconductance amplifier. The transconductance amplifier is connectable to a microelectromechanical system (MEMS) transducer for example via a common carrier substrate including appropriate electrical wiring or traces. Embodiments of the integrated circuit are described in detail below with reference to the appended drawings.

Some aspects of the present disclosure relate to an integrated circuit comprising a transconductance amplifier which is connectable to a microelectromechanical system (MEMS) transducer. The transconductance amplifier comprising a first input coupled to a first current conveyor and a second input coupled to a second current conveyor for converting a single-ended or differential transducer signal voltage into an intermediate signal current representative of the transducer signal voltage through a shared reference resistor. The transconductance amplifier further comprises first and second output circuits coupled to the shared reference resistor and being configured to convert the intermediate current signal into a corresponding differential output current signal through first and second output terminals for driving a load. Certain embodiments of transconductance amplifier comprises first and second class AB output stages to minimize quiescent current consumption of the transconductance amplifier without compromising load driving capability at large transducer signal voltages. In embodiments, the first and second class AB output stages are coupled without any voltage signal feedback from the first and second output terminals back to the first and second inputs, respectively, of the transconductance amplifier. The lack of voltage feedback around the class AB output stages ensures that the transconductance amplifier exhibits high output impedance which is a beneficial property for the reasons discussed in additional detail elsewhere in the specification. The transconductance amplifier may be designed or configured to exhibit an output impedance, measured at 1 kHz, larger than 1 MΩ, or preferably larger than 10 MΩ such as larger than 50 MΩ.

Some aspects of the present disclosure relate to a microphone assembly comprising a housing and a microelectromechanical system transducer element disposed in the housing. The transducer element is configured to convert sound into a transducer signal voltage at a transducer output. The microphone assembly additionally comprises the above-described integrated circuit including the transconductance amplifier. At least one of the first and second inputs of the transconductance amplifier is connected to the transducer output for receipt of the transducer signal voltage. The microphone assembly may additionally comprises an analog-to-digital converter (I-ADC) comprising a first and second input nodes connected to receive the differential output current signal, said analog-to-digital converter (I-ADC) being configured to sample and quantize the amplified current signal to generate a corresponding digital transducer signal.

What is claimed is:

1. An integrated circuit for interfacing with a microelectromechanical systems (MEMS) transducer of a sensor assembly, the integrated circuit comprising:
   a transconductance amplifier coupleable to the MEMS transducer, the transconductance amplifier comprising:
   a first current conveyor including a first input stage having a first transistor biased by a bias current source and configured to apply a first polarity of a transducer signal voltage to a shared reference resistor, the bias current source of the first input stage configured to maintain a substantially constant DC bias current through the first transistor despite variations in the transducer signal voltage;
   a second current conveyor including a second input stage having a second transistor biased by a bias current source and configured to apply a second polarity of the transducer signal voltage to the shared reference resistor, the bias current source of the second input stage configured to maintain a substantially constant DC bias current through the second transistor despite variations in the transducer signal voltage,
   wherein the first current conveyor and the second current conveyor convert the transducer signal voltage to an intermediate current signal when the integrated circuit is coupled to the MEMS transducer; and
   a first output circuit and a second output circuit coupled to the shared reference resistor and configured to convert the intermediate current signal into a corresponding differential output current signal through a first output terminal and a second output terminal.

2. The integrated circuit of claim 1, wherein:
the first output circuit comprises a first class AB output stage and a first output bias circuit configured to set a predetermined quiescent current through the first class AB output stage; and
the second output circuit comprises a second class AB output stage and a second output bias circuit configured to set a predetermined quiescent current through the second class AB output stage.

3. The integrated circuit of claim 2, wherein:
the first class AB output stage comprises a first output transistor and a second output transistor connected in series between a positive DC supply voltage and a negative DC supply voltage, the first output terminal coupled to a connection between the first output transistor and the second output transistor; and
the second class AB output stage comprises a third output transistor and a fourth output transistor connected in series between the positive DC supply voltage and the negative DC supply voltage, the second output terminal coupled to a connection between the third output transistor and the second output transistor.

4. The integrated circuit of claim 3, wherein:
the first output circuit comprises a first push-pull current mirror arrangement configured to copy the intermediate current signal to the first class AB output stage to generate a first polarity of the differential output current signal; and
the second output circuit comprises a second push-pull current mirror arrangement configured to copy the intermediate current signal to the second class AB output stage to generate a second polarity of the differential output current signal.

5. The integrated circuit of claim 4, wherein:
the first push-pull current mirror arrangement comprises an output node connected to a first end of the shared reference resistor for sinking and sourcing a first polarity of the intermediate current signal; and
the second push-pull current mirror comprises an output node connected to a second end of the shared reference resistor for sinking and sourcing a second polarity of the intermediate current signal.

6. The integrated circuit of claim 5, wherein:
the first output bias circuit is configured to set respective gate-source voltages of a PMOS transistor and an NMOS transistor of the first push-pull current mirror arrangement; and the second output bias circuit is configured to set respective gate-source voltages of a PMOS transistor and an NMOS transistor of the second push-pull current mirror arrangement.

7. The integrated circuit of claim 6, wherein:
a gate terminal of the PMOS transistor of the first push-pull current mirror is coupled to a gate terminal of the first output transistor of the first class AB output stage;
a gate terminal of the NMOS transistor of the first push-pull current mirror is coupled to a gate terminal of the second output transistor of the first class AB output stage;
a gate terminal of the PMOS transistor of the second push-pull current mirror is coupled to a gate terminal of the first output transistor of the second class AB output stage; and
a gate terminal of the NMOS transistor of the second push-pull current mirror is coupled to a gate terminal of the second output transistor of the second class AB output stage.

8. The integrated circuit of claim 7, further comprising:
a first current feedback loop coupled from the drain terminal or collector terminal of the first input transistor to the first output bias circuit to set the differential output current signal through the first class AB output stage by passing a first error current through a first current buffer circuit, the error current configured to adjust respective gate voltages of the first and second output transistors of the first class AB output stage such that the respective signal currents through the first output transistor and the second output transistor achieve current balance around the first input transistor; and
a second current feedback loop coupled from the drain terminal or collector terminal of the second input transistor to the second output bias circuit to set the differential output current signal through the second class AB output stage by passing a second error current through a second current buffer circuit, the second error current configured to adjust respective gate voltages of the third output transistor and the fourth output transistor of the second class AB output stage such that the respective signal currents through third output transistor and the fourth output transistor achieve current balance around the fourth input transistor.

9. The integrated circuit of claim 1, wherein the shared reference resistor determines an intermediate transconductance of the first input stage and the second input stage.

10. The integrated circuit of claim 9,
the first transistor comprising a first control terminal for receipt of the first polarity of the transducer signal voltage;
the bias current source of the first input stage comprising a first current source coupled to a drain of the first transistor and a second current source coupled to a source of the first transistor, wherein DC bias currents of the first and second current sources of the first input stage are essentially equal; and
the second transistor comprising a first control terminal for receipt of the second polarity of the transducer signal voltage;
the bias current source of the second input stage comprising a first current source coupled to a drain of the second transistor and a second current source coupled to a source of the second transistor, wherein DC bias currents of the first and second current sources of the second input stage are essentially equal.

11. The integrated circuit of claim 1, wherein a predetermined transconductance of the transconductance amplifier is larger than $$\frac{1}{200 \text{ kohm}}.$$

12. The integrated circuit of claim 1, wherein an input impedance, at 1 kHz, of the transconductance amplifier is larger than 100 MΩ.

13. The integrated circuit of claim 12, wherein the input impedance, at 1 kHz, is larger than 1 GΩ.

14. A microphone assembly comprising:
a housing;
a MEMS transducer disposed in the housing, the transducer configured to convert sound into a transducer signal voltage at a transducer output; and
an integrated circuit comprising a transconductance amplifier, the transconductance amplifier comprising:
a first current conveyor including a first input stage having a first transistor biased by a first current source that maintains a substantially constant DC bias current through the first transistor despite variations in the transducer signal voltage, the first current conveyor applying a first polarity of the transducer signal voltage to a shared reference resistor;
a second current conveyor including a second input stage having a second transistor biased by a current source that maintains a substantially constant DC bias current through the second transistor despite variations in the transducer signal voltage, the second current conveyor applying a second polarity of the transducer signal voltage to the shared reference resistor,
wherein the first input stage and the second input stage convert the transducer signal voltage into an intermediate current signal; and
a first output circuit and a second output circuit coupled to the shared reference resistor and configured to convert the intermediate current signal into a corresponding differential output current signal through a first output terminal and a second output terminal;
wherein at least one of the first input stage or the second input stage of the transconductance amplifier is coupled to the transducer output for receipt of a single-ended or a differential transducer signal voltage.

15. The microphone assembly of claim 14, wherein the integrated circuit further comprises:
an analog-to-digital converter comprising a first input node and a second input node, the analog-to-digital converter configured to receive the differential output current signal and to sample and quantize the differential output current signal to generate a corresponding digital transducer signal.

16. A sensor system comprising:
a housing;
a MEMS transducer element disposed in the housing, the transducer configured to convert a first physical variable into a transducer signal voltage;
an integrated circuit disposed in the housing and comprising:
a transconductance amplifier comprising first and second current conveyors each current conveyor having a corresponding input stage coupled to a shared reference resistor and configured to receive a single-ended or a differential transducer signal voltage from the MEMS transducer, each input stage including a transistor, a first bias current source connected to a source or emitter terminal of the transistor, and a second bias current source connected to a drain or collector terminal of the transistor, the first and second current sources creating a substantially constant DC bias current through the first transistor despite variations in the transducer signal voltage, wherein the input stages are configured to convert the transducer signal voltage transferred to the shared reference resistor to an intermediate current signal;

a first output circuit coupled to the shared reference resistor and configured to convert the intermediate current signal into a corresponding differential output current signal;

an analog-to-digital converter coupled to the first output circuit and configured to sample and quantize the differential output current signal to generate a corresponding digital transducer signal.

17. The sensor system of claim 16, wherein the first output circuit comprises a first class AB output stage and a first output bias circuit configured to set a predetermined quiescent current through the first class AB output stage.

18. The sensor system of claim 17, wherein the first class AB output stage of the transconductance amplifier comprises a first output transistor and a second output transistor connected in series between a positive DC supply voltage and a negative DC supply voltage, the first output terminal comprising a connection between the first output transistor and the second output transistor.

19. The sensor system of claim 16, wherein:

the first current conveyor is configured to apply a first polarity of the transducer signal voltage to the shared reference resistor; and the second current conveyor is configured to apply a second polarity of the transducer signal voltage to the shared reference resistor.

20. The sensor system of claim 16, wherein an effective input impedance, at 1 kHz, of the analog-to-digital converter is smaller than 1 kΩ.

* * * * *